United States Patent [19]

Taylor et al.

[11] Patent Number: 5,044,714

[45] Date of Patent: Sep. 3, 1991

[54] VARIABLE INTERVAL ELECTROMAGNETIC PULSE TRAIN GENERATOR

[75] Inventors: James D. Taylor, Cambridge, Mass.; Michael M. Salour, Carlsbad; James H. Bechtel, San Diego, both of Calif.

[73] Assignee: The United States of America as Represented by the Secretary of the Air Force, Washington, D.C.

[21] Appl. No.: 611,194

[22] Filed: Nov. 9, 1990

[51] Int. Cl.[5] .......................... G02B 6/10; H01L 27/14
[52] U.S. Cl. .......................................... 385/5; 357/30; 385/1; 359/241
[58] Field of Search ............... 350/96.11, 96.12, 96.13, 350/96.14, 96.15, 354, 355, 356; 307/429, 409, 419; 357/19, 30, 45, 25

[56] References Cited

U.S. PATENT DOCUMENTS

| | | | |
|---|---|---|---|
| 3,827,000 | 7/1974 | Matsushita et al. | 350/96.14 |
| 4,222,638 | 9/1980 | Robert | 350/96.14 |
| 4,626,075 | 12/1986 | Chemla | 350/354 |
| 4,787,714 | 11/1988 | Greene et al. | 350/96.13 X |
| 4,843,586 | 6/1989 | Nazarathy et al. | 350/96.14 |
| 4,844,572 | 7/1989 | Popovic | 350/96.14 |
| 4,867,515 | 9/1989 | Normandin | 350/96.13 |
| 4,904,039 | 2/1990 | Soref | 350/96.14 |
| 4,941,725 | 7/1990 | Normandin | 350/96.13 |

FOREIGN PATENT DOCUMENTS 59-113424  6/1984  Japan ........................ 350/96.14 X Primary Examiner—Brian Healy
Attorney, Agent, or Firm—Jacob N. Erlich; Donald J. Singer

[57] ABSTRACT

A variable interval electromagnetic pulse train generator having a semiconductor substrate on which is mounted on one surface thereof a plurality of spaced apart electrodes and on another surface thereof an electrode base plate. A voltage source is connected to each of the plurality of spaced apart electrodes while the space between electrodes have optical pulses directed thereon. By controlling the voltage applied to the electrodes and the optical pulses directed between electrodes the pulse train generator is capable of emitting a series of variable, spaced apart electromagnetic pulses.

14 Claims, 2 Drawing Sheets

VARIABLE INTERVAL ELECTROMAGNETIC PULSE TRAIN GENERATOR

STATEMENT OF GOVERNMENT INTEREST

The invention described herein may be manufactured and used by or for the Government for governmental purposes without the payment of any royalty thereon.

BACKGROUND OF THE INVENTION

This invention relates generally to pulse generators, and, more particularly, to a very fast, variable interval, electromagnetic pulse train generator which relies upon controlled optical pulses to control the duration of each pulse and the interval of time between pulses.

Pulse generators have been in existence for many years. Generally, pulse generators provide wide band, short period, high power level outputs. The emphasis in past pulse generators was to simply obtain a short pulse with a fast current acceleration. In such generators, the energy was stored, dumped therefrom, and the results measured. Generating a closely spaced pulsed train was, in most instances, not essential, and generating a variable voltage and variable interval pulse train was definitely not considered for high power levels. Examples of typical pulse generators are as follows:

(a) The wave form synthesizer. This type of pulse generator was primarily developed for laboratory applications, was dependent upon to digital to analog conversion and was of low power. If such synthesizers were coupled to a high powered amplifier, the amplifier would have to be a narrow band device which would not be efficient for wide band signals.

(b) The Blumlein line. This type of generator is in the form of a transmission line attached to a cavity device such as a magnatron. An antenna in the transmission line is located at a null point in the standing wave. When the line is suddenly shortened, by closing a switch, a standing wave moves to the antenna and produces a short, high level dump of energy. This action can produce short, several cycle, pulses of sinusoidal energy at high levels. Such a device cannot vary the center frequency of the signal.

(c) The frozen Hertzian generator. This is another device for generating pulses with large relative band widths. At the present time, frozen Hertzian generators use only one or two switches and a single high voltage supply. The frozen Hertzian generator yields a single pulse or square wave cycle electric field which propagates down a transmission line to an antenna.

(d) The Marx generator. This device is capable of producing high voltage pulses by charging capacitors in parallel and then discharging them in series. Presently the switching action depends upon the utilization of spark gaps. The Marx generator is an example of a generator which provides raw power pulses.

U.S. Pat. No. 3,484,619 issued on Dec. 16, 1969 to Joseph M. Proud, Jr. is cited as an example of a radio frequency generator, while U.S. Pat. No. 4,329,686 issued May 11, 1982 to Gerard Mourou is cited as an example of an apparatus of generating microwave pulses. Both of these generators are also illustrative of the type of pulse generators in use today.

With the development of non-sinusoidal radar, it has become necessary to incorporate therein pulse generators capable of producing very fast electrical pulses, that is, very short duration (approximately 2 ns) pulses with picosecond rise times. Unfortunately, pulse generators of the past and of the type described above have several shortcomings, especially in the production of very fast, variable interval, electromagnetic pulse trains. The present invention sets forth a pulse generator which overcomes these shortcomings.

SUMMARY OF THE INVENTION

The present invention overcomes the problems set forth above by providing a very high speed, variable interval, electromagnetic pulse train generator which utilizes very fast optical switching in a semiconductor to create pulses having very short rise times. More specifically, the very fast rise time can be achieved by rapidly switching the conductivity of the semiconductor by the use of picosecond duration optical pulses.

The pulse train generator of this invention is made up of a semiconductor substrate having mounted on one side thereof a series of spaced apart electrodes. Mounted on the other side thereof is an (electrode) base plate. Each of the electrodes in series, except for the last electrode, is connected to a voltage source. In certain circumstances the last electrode may also be connected to a voltage source. The space between electrodes, called the switching area or region, has directed thereon an optical pulse.

Each of the electrodes in series are charged by the voltage source. When the switching areas between adjacent electrodes are closed (made conductive) by the application of an optical pulse thereto, a voltage pulse travels along the series of electrodes. Stated more succinctly, the conducting electrode surfaces on one side of the semiconductor substrate in combination with the conductive base plate on the other side of the semiconductor substrate form a capacitor-like device. When a voltage is placed on any of the electrode surfaces, an electric field develops between the series of electrodes and the base plate. The intensity of the electric field depends upon the potential on the series of electrodes.

The switching areas between the conducting electrodes act as a light activated switches. When an optical pulse is directed on and shines upon the switching areas, charge carriers are created and that portion of the semiconductor (switching area) becomes a conductor in that region. The sudden acceleration of charge between the electrode surfaces and base plate creates a changing electromagnetic field. This field moves radially in all directions at the speed of light from the region of conduction. This surge of electromagnetic energy is in the form of an electromagnetic pulse. Repeating the process of charging and discharging the capacitance areas at varying times varies the output waveform and provides a number of pulses with controllable amplitudes and intervals.

The pulse generator of this invention produces an electromagnetic pulse train which exits adjacent one end of the substrate. Increasing the distance between the conducting electrode surfaces, that is, the switching area, results in several advantages. For example, since the increased spacing does not change the total device "on" resistance, the joule heating per unit spacing, the current per unit spacing, the optical energy density on the material, and the total device inductance are all decreased and the surface available for heat removal is increased. Therefore, the average power and the peak power produced by the pulse generator of this invention are directly related to the spacing of the switching area.

It is therefore an object of this invention to provide an electromagnetic pulse train generator which is capable of producing pulses of variable duration and having a variable time delay between pulses.

It is another object of this invention to provide an electromagnetic pulse train generator which is capable of producing pulses of very short rise time.

It is still another object of this invention to provide an electromagnetic pulse train generator which is capable of being incorporated within a wide variety of fiber optic devices.

For a better understanding of the present invention, together with other and further objects thereof, reference is made to the following description taken in conjunction with the accompanying drawings and its scope will be pointed out in the appended claims.

DETAILED DESCRIPTION OF THE PREFERRED EMBODIMENTS

Figure 1:
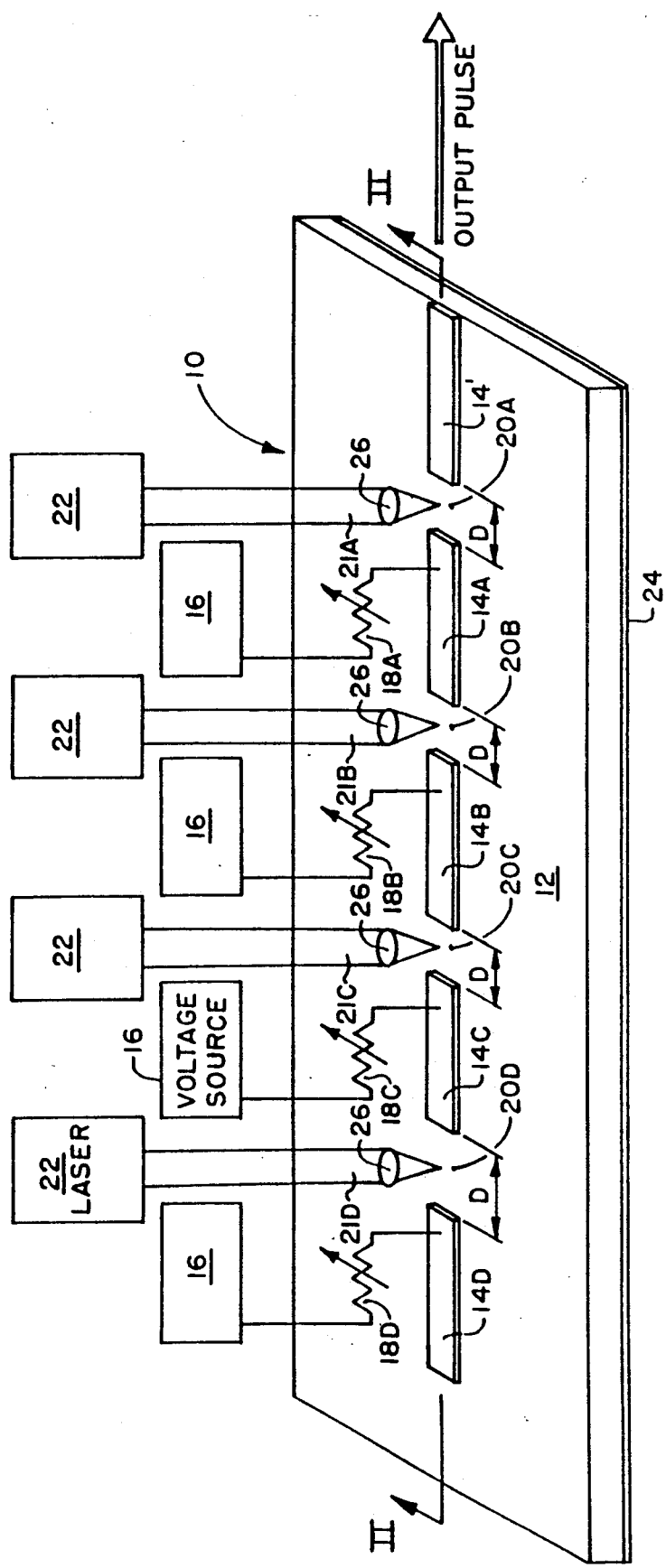
FIG. 1 is a pictorial, schematic illustration of the electromagnetic pulse train generator of this invention.
Figure 2:
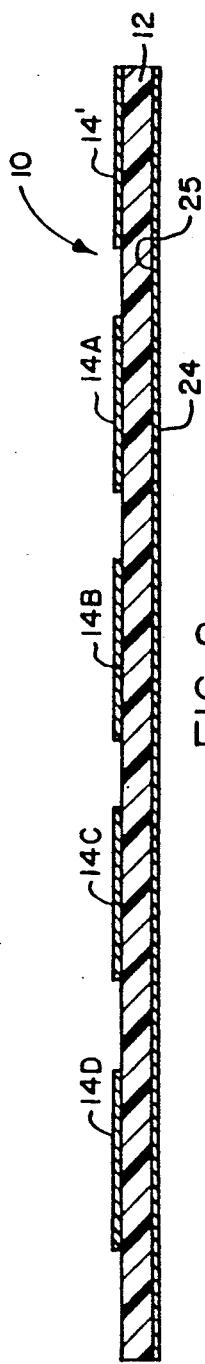
FIG. 2 is a side elevational view of the electromagnetic pulse generator of this invention, shown in cross section and taken along line II of FIG. 1.

Reference is now made to FIGS. 1 and 2 of the drawings which clearly depict the electromagnetic pulse train generator 10 of the present invention.

Pulse train generator 10 is formed of a base or substrate 12 made of any suitable semiconductor material such as silicon, gallium arsenide, or germanium. Substrate 12 is preferably of a thickness of a few millimeters to a few centimeters and its length may vary in accordance with the length and number of electrodes 14 mounted thereon. These dimensions, however, may vary within the scope of of this invention. Mounted, in series, upon substrate 12 as clearly illustrated in FIG. 1 of the drawings are a plurality of electrodes 14 made preferably of copper or aluminum. Electrodes 14 may vary in number and, as shown in FIGS. 1 and 2, may be of various lengths. Each of the electrodes 14 are connected to a respective voltage source 16 and, although electrode 14' is illustrated in the drawings as not being connected to a voltage source 16, if preferred, it may also be connected to a voltage source. Connecting electrode 14' to a voltage source would add a DC bias to the output pulse. Furthermore, the voltages from each of the sources 16 may differ and have different polarities. The generated output electromagnetic pulses exit adjacent an end of substrate 12, and, as shown in FIG. 1, this end would be adjacent electrode 14'.

Interconnected between each voltage source 16 and its respective electrode 14 is any suitable, conventional variable resistor 18(A-D). The duration of the pulses generated are related to the length of each of the electrodes while their amplitude is controlled by the value of the voltage from voltage sources 16. The length of electrodes 14 may vary from a few centimeters to many meters, while the width of each electrode 14 is preferably of a few millimeters to a few centimeters. Typical pulse durations can range from a few picoseconds to a few nanoseconds based upon the length of electrodes 14. However, even larger pulse durations are possible with electrode lengths of many meters.

Each of the electrodes 14 are spaced apart from each other a predetermined width or distance D, this distance D hereinafter being referred to as the switching area or region 20(A-D). Typical switching area widths 20 between electrodes 14 are of a fraction of a millimeter to a few centimeters as long as the width is sufficiently large that no dielectric breakdown occurs between adjacent electrodes 14.

Focused into each of the switching areas 20 are pulses of light 21(A-D) emanating from any suitable optical source such as a semiconductor lasers 22. The specific energy required from each laser 22 being determined by the space (switching areas 20) between electrodes 14. Lasers 22 of values as low as a fraction of a microjoule are possible with the present invention, however, larger high voltage generators may require several millijoules per switching area 20.

Completing the physical structure of pulse generator 10 is a conductive element (electrode) in the form of a base plate 24. Base plate 24 is mounted on the surface 25 of substrate 12 opposite electrodes 14 and 14'. Base plate 24 may be in the form of a conductive strip of material such as copper or aluminum or may be configured to cover the entire surface 25. Conventional lenses 26 are utilized to focus light pulses 21 onto respective switching areas 20.

The present invention provides a pulse generator 10 capable of emitting an output train of electromagnetic pulses. Voltages that can be achieved with the present invention can vary between a few volts and a few thousand volts. The amplitude of the emitted pulses are controlled by voltage sources 16 and the sizes of resistors 18 are utilized to limit the current from voltage sources 16 as well as determine the recharging time of electrodes 14. The interval between pulses is dependent upon the time interval between optical pulses 21 in switching areas 20. The rise time of each generated output pulse is related to the specific material of semiconductor substrate 12, the spacing between adjacent electrodes 14 and the rise times of optical pulses 21. The duration of each output pulse is equal to $2L/V_E$ where $L=$ the length of electrode 14 and $V_E=$ the propagation velocity along the electrode.

Figure 3:
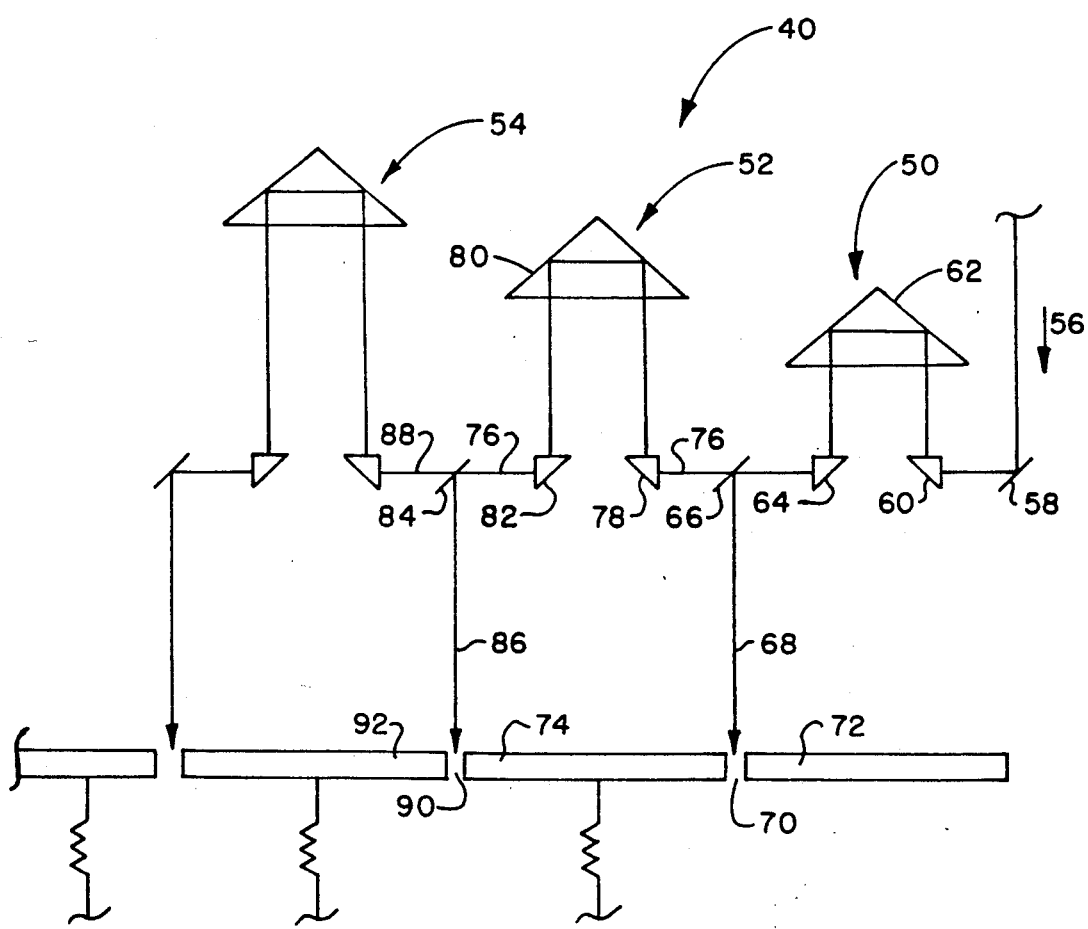
FIG. 3 is a schematic illustration of another embodiment of the electromagnetic pulse train generator of this invention incorporating therein a plurality of optical delay lines.

FIG. 3 of the drawings represents an embodiment 40 of the present invention incorporating therein a series of optical delay lines 50, 52 and 54 capable of triggering successive optical pulses. More specifically, an incident optical pulse 56 emanating from a laser source (not shown) is directed by mirror 58 to prisms 60, 62 and 64 of optical delay line 50. Optical pulse 56 then travels to beamsplitter 66 where a portion 68 of pulse 56 is directed to switching area 70 between electrodes 72 and 74. The remaining portion 76 of pulse 56 is sent to delay line 52 formed by prisms 78, 80 and 82. This portion 76 is then split by beamsplitter 84 into portions 86 and 88. Portion 86 of original pulse 56 is directed to switching area 90 between adjacent electrodes 74 and 92. Additional delay lines 54, etc. can be utilized to provide a series of optical pulses. Furthermore, small prisms 60, 64, 78 and 82 may be in the form of mirrors or other suitable reflecting elements. Electrodes 72, 74, 92, etc. need not have the same length and the time delay between pulses emanating from optical delay lines 50, 52 and 54 can be different.

MODE OF OPERATION

Reference is once again made to FIG. 1 of the drawings which clearly depicts pulse generator 10 with an output voltage pulse exiting therefrom via electrode 14' and base plate electrode 24. In normal operation, electrodes 14 are charged to different voltages. Once electrode 14A is fully charged through resistor 18A, optical pulse 21A will activate switching area 20A to close switching area 20A. Application of optical pulse 21A will allow electrode 14A to discharge through the closed switching area 20A and allow the voltage pulse to exit generator 10 through electrode 14'. Sequential optical pulses 21B, 21C and 21D can close switching areas 20B, 20C and 20D, to produce a series of voltage pulses that will travel along the electrodes 14 and through the switching areas 20 that will still be closed and exit through electrode 14'.

The semiconductor material that is used for substrate 12 is chosen such that once the switching areas 20 are optically closed, they remain closed (conducting) long enough that all pulses can exit generator 10. This requires having a semiconductor material that has a recombination lifetime that is long compared to the duration of all pulses that will travel through the switching area 20A, the one that will have the largest number of pulses that pass through it. Usually the switching areas 20(A–D) are activated with time delays between successive optical pulses. This will produce delays between the corresponding output voltage pulses. In addition, the semiconducting material must absorb the incident optical radiation. This will allow an increase in the electrical conductivity of the switch with the incident optical radiation. The individual output voltage pulses have a duration that is determined by the lengths of the individual electrodes. There is no intrinsic limit to this length and individual portions can be electrically connected to each other.

As shown in FIG. 1, electrode 14' normally does not have a voltage applied to it because it is the output electrode for generator 10. However, if a voltage is applied to electrode 14', this voltage will produce a DC bias to the output pulse.

Although this invention has been described with reference to particular embodiments, it will be understood to those skilled in the art that this invention is also capable of further and other embodiments within the spirit and scope of the appended claims.

We claim:

1. A variable interval electromagnetic pulse train generator, comprising:
   a substrate, said substrate being made of a semiconductor material;
   a plurality of electrodes mounted in series on a surface of said substrate, said electrodes being spaced apart from each other a predetermined distance, forming therebetween a plurality of switching areas;
   a base plate, said base plate being in the form of an electrode mounted on a surface of said substrate opposite said surface having said spaced apart electrodes thereon;
   means for applying a predetermined voltage to said spaced apart electrodes; and
   means for applying a controllable optical pulse to each of said plurality of switching areas;
   whereby said pulse train generator is capable of emitting a series of variable, spaced apart electromagnetic pulses.

2. A variable interval electromagnetic pulse train generator as defined in claim 1, wherein said means for applying said controllable optical pulse comprises a plurality of optical delay lines.

3. A variable interval electromagnetic pulse train generator as defined in claim 1, wherein said voltage applying means comprises a voltage source and a resistor interposed between said voltage source and said electrodes.

4. A variable interval electromagnetic pulse train generator as defined in claim 3, wherein said means for applying said controllable optical pulse comprises a plurality of optical delay lines.

5. A variable interval electromagnetic pulse train generator as defined in claim 4, wherein said optical pulse applying means comprises a laser.

6. A variable interval electromagnetic pulse train generator as defined in claim 5, wherein each of said delay lines comprises a plurality a prisms.

7. A variable interval electromagnetic pulse train generator as defined in claim 1, wherein one of said spaced apart electrodes does not have a voltage applied thereto.

8. A variable interval electromagnetic pulse train generator as defined in claim 3, wherein one of said spaced-apart electrodes does not have a voltage applied thereto.

9. A variable interval electromagnetic pulse train generator as defined in claim 4, wherein said semiconductor substrate is made of gallium arsenide.

10. A variable interval electromagnetic pulse train generator as defined in claim 4, wherein said semiconductor substrate is made of silicon.

11. A variable interval electromagnetic pulse train generator as defined in claim 4, wherein said semiconductor substrate is made of germanium.

12. A variable interval electromagnetic pulse train generator as defined in claim 1, wherein said electrodes may be of different lengths and said electrode lengths control the duration of said emitted pulses.

13. A variable interval electromagnetic pulse train generator as defined in claim 4, wherein said electrodes may be of different lengths and said electrode lengths control the duration of said emitted pulses.

14. A variable interval electromagnetic pulse train generator as defined in claim 6, wherein said electrodes may be of different lengths and said electrode lengths control the duration of said emitted pulses.

* * * * *